United States Patent
Ray

(10) Patent No.: US 7,760,869 B2
(45) Date of Patent: Jul. 20, 2010

(54) METHOD AND APPARATUS FOR CONTROLLING THE TRANSMIT VOLUME LEVEL OF A SPEAKERPHONE

(75) Inventor: Amar Nath Ray, Shawnee, KS (US)

(73) Assignee: Embarq Holdings Company, LLC, Overland Park, KS (US)

( * ) Notice: Subject to any disclaimer, the term of this patent is extended or adjusted under 35 U.S.C. 154(b) by 135 days.

(21) Appl. No.: 12/200,381

(22) Filed: Aug. 28, 2008

(65) Prior Publication Data

US 2010/0054456 A1    Mar. 4, 2010

(51) Int. Cl.
- H04M 1/00 (2006.01)
- H04M 9/00 (2006.01)
- H03G 3/00 (2006.01)

(52) U.S. Cl. .................. 379/420.01; 379/388.03; 379/395; 381/107

(58) Field of Classification Search ......... 379/419, 379/420.01–420.03, 433.01–433.02, 388.01–388.06, 379/395; 455/569.1; 381/93, 104, 107, 108
See application file for complete search history.

(56) References Cited

U.S. PATENT DOCUMENTS

| | | | | |
|---|---|---|---|---|
| 5,646,990 A | * | 7/1997 | Li ..................... | 379/406.08 |
| 5,657,384 A | * | 8/1997 | Staudacher et al. ..... | 379/406.08 |
| 5,768,364 A | * | 6/1998 | Karnowski et al. ..... | 379/388.02 |
| 5,796,819 A | * | 8/1998 | Romesburg ........... | 379/406.09 |
| 5,867,574 A | * | 2/1999 | Eryilmaz ............. | 379/388.04 |
| 6,195,437 B1 | * | 2/2001 | Markow et al. ....... | 381/93 |
| 6,282,176 B1 | * | 8/2001 | Hemkumar ........... | 370/276 |
| 6,418,203 B1 | * | 7/2002 | Marcie ............... | 379/90.01 |
| 6,434,407 B1 | * | 8/2002 | Cook ................. | 455/569.1 |
| 2002/0076037 A1 | * | 6/2002 | Nishimura ........... | 379/406.01 |
| 2003/0044028 A1 | * | 3/2003 | Cranfill et al. ....... | 381/107 |
| 2007/0147627 A1 | * | 6/2007 | Pocino et al. ........ | 381/71.1 |

* cited by examiner

Primary Examiner—Tuan D Nguyen

(74) Attorney, Agent, or Firm—Sonnenschein Nath & Rosenthal LLP

(57) ABSTRACT

A method and apparatus for controlling the transmit volume level of a speakerphone includes receiving a transmit audio signal. If the speakerphone is in a speakerphone mode, the method further includes measuring a send output level of the transmit audio signal, comparing the send output level of the transmit audio signal with a send output level threshold value, and controlling the send output level of the transmit audio signal based upon the comparison of the send output level of the transmit audio signal and the send output level threshold value using automatic gain control. Some embodiments further include determining the send output level threshold value based upon a send loudness rating (SLR) target difference value between a speakerphone SLR target value and a handset SLR target value. In some embodiments, if the speakerphone is in a handset mode, the send output level of the transmit audio signal remains substantially the same.

17 Claims, 4 Drawing Sheets

METHOD AND APPARATUS FOR CONTROLLING THE TRANSMIT VOLUME LEVEL OF A SPEAKERPHONE

BACKGROUND

The use of speakerphones is gaining in popularity. Typically, a speakerphone allows a user to selectively hold a handset to participate in a conversation while in a handset mode, or operate in a handsfree manner using a speaker and microphone built into the speakerphone base when in a speakerphone mode. An advantage of using the speakerphone mode is that a telephone user may more easily work and communicate at the same time. For example, while working in the kitchen, office, or while engaged in some other form of work, someone may talk over the phone simply by placing the phone in the speakerphone mode. However, from time-to-time, change of the user's mouth position relative to the speakerphone can make a substantial impact on the transmit signal level. For example, someone speaking into a speakerphone may turn his or her head to look at his or her computer, thereby attenuating his or her voice prior to reaching the speakerphone. Fluctuations of the transmit signal levels can degrade the quality of the voice signals received by a user on the other end of the telecommunications network. In many cases, the continuous fluctuations of the transmit signal levels demands more listening attention of the person on the other end of the conversation. This fluctuation in transmit signal level can degrade the quality of experience of the person at the other end of the telecommunications network.

SUMMARY

Embodiments of the present invention provide for controlling the transmit volume level of a speakerphone automatically using automatic gain control (AGC) in the speakerphone's transmission system. Further embodiments of the invention provide for a procedure for identifying and selecting a threshold value to use in controlling the transmit volume level of the speakerphone.

An embodiment of a method for controlling the transmit volume level of a speakerphone includes receiving a transmit audio signal. If the speakerphone is in a speakerphone mode, the method further includes measuring a send output level of the transmit audio signal, comparing the send output level of the transmit audio signal with a send output level threshold value, and controlling the send output level of the transmit audio signal based upon the comparison of the send output level of the transmit audio signal and the send output level threshold value using automatic gain control. Some embodiments further include determining the send output level threshold value based upon a send loudness rating (SLR) target difference value between a speakerphone SLR target value and a handset SLR target value. In some embodiments, if the speakerphone is in a handset mode, the send output level of the transmit audio signal remains substantially the same.

Another embodiment of a method for controlling the transmit volume level of a speakerphone includes receiving an audio signal from a user of a speakerphone, altering the audio signal by applying an automatic gain control function to the audio signal, and communicating the altered audio signal over a communications network. In some embodiments, altering the transmit audio signal includes measuring an output level of the audio signal, comparing the output level of the audio signal with an output level threshold value, and altering the output level of the audio signal based upon the comparison of the output level of the audio signal and the output level threshold value.

An embodiment of an apparatus for controlling the transmit volume level of a speakerphone includes an automatic gain control module. The automatic gain control module configured to receive a transmit audio signal. If the speakerphone is in a speakerphone mode, the automatic gain control module is configured to measure a send output level of the transmit audio signal, compare the send output level of the transmit audio signal with a send output level threshold value, and control the send output level of the transmit audio signal based upon the comparison of the send output level of the transmit audio signal and the send output level threshold value using automatic gain control. Some embodiments further include determining the send output level threshold value based upon a SLR target difference value between a speakerphone SLR target value and a handset SLR target value. In some embodiments, if the speakerphone is in a handset mode, the send output level of the transmit audio signal remains substantially the same.

BRIEF DESCRIPTION OF THE DRAWINGS

Illustrative embodiments of the present invention are described in detail below with reference to the attached drawing figures, which are incorporated by reference herein and wherein:

FIG. 6 is another embodiment of a procedure for controlling the transmit volume level of a speakerphone.

DETAILED DESCRIPTION OF THE DRAWINGS

Figure 1:
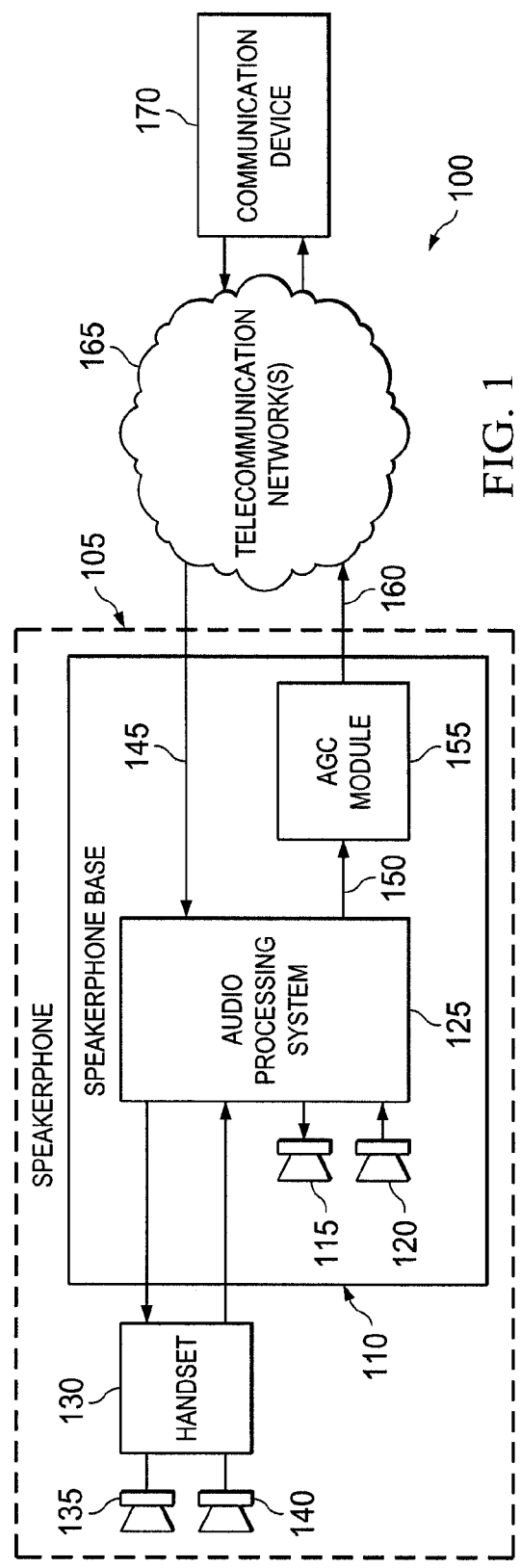
FIG. 1 is an embodiment of a system for controlling the transmit volume level of a speakerphone.

FIG. 1 is an embodiment of a system 100 for controlling the transmit volume level of a speakerphone. The system 100 includes a speakerphone 105 having a handset mode and a speakerphone mode. In at least one embodiment, the speakerphone 105 is a digital speakerphone. In still other embodiments, the speakerphone 105 is an analog speakerphone, such as a PSTN speakerphone. In still other embodiments, the speakerphone 105 may be a voice-over-IP (VoIP) phone having speakerphone capability. The speakerphone 105 includes a speakerphone base 110. The speakerphone base 110 includes a base audio output 115. In at least one embodiment, the base audio output 115 is a speaker within the speakerphone base 110. The speakerphone base 110 further includes a base audio input 120. In at least one embodiment, the base audio input 120 is a microphone in the speaker base 110. The base audio output 115 and the base audio input 120 are in communication within audio processing system 125. The speakerphone 105 further includes a handset 130 in communication with the speakerphone base 110. In at least one embodiment, the handset 130 is a wireless handset in communication with the speakerphone base 110 via a wireless connection. In another embodiment, the handset 130 is a wired handset coupled to the speakerphone base 110 via a wired connection. The handset 130 includes a handset audio output 135 and a handset audio input 140. In at least one embodiment, the handset audio output 135 is a speaker in the handset 130. In another embodiment, the handset audio input 140 is a microphone in the handset 130.

In various embodiments, the speakerphone base 110 further includes an automatic gain control (AGC) module 155 in communication with the audio processing system 125. The speakerphone 105 is in communication with a telecommunication network(s) 165. In various embodiments, the telecommunication network(s) 165 may include one or more of a wired network, a wireless network, or the Internet. In a particular embodiment, the telecommunication network(s) 165 include one or more PSTN networks. The audio processing system 125 is configured to receive a received audio signal 145 from the telecommunication network(s) 165, process the received audio signal 145, and output the processed audio signal to either the base audio output 115 or the handset audio output 135. In at least one embodiment, the audio processing system 125 outputs the audio signal to the handset audio output 135 when the speakerphone 105 is in the handset mode, and outputs the audio signal to the base audio output 115 when the speakerphone 105 is in the speakerphone mode. The audio processing system 125 is further configured to receive an audio input signal from either of the base audio input 120 or the handset audio input 140, process the audio input signal, and output a transmit audio signal 150. In one embodiment, the audio processing system 125 is configured to receive the audio input signal from the base audio input 120 when the speakerphone 105 is in the speakerphone mode, and receive the input audio signal from the handset audio input 140 when the speakerphone 105 is in the handset mode. In various embodiments, the AGC module 155 controls an output level of the transmit audio signal 150 when the speakerphone 105 is in the speakerphone mode to produce a controlled transmit audio signal 160, and leaves the output level of the transmit audio signal 150 substantially unchanged when the speakerphone 105 is in the handset mode.

In the embodiment illustrated in FIG. 1, the system 100 further includes a communication device 170. In various embodiments, a user of the speakerphone 105 may communicate with a user of the communication device 170 via the telecommunication network(s) 165. In the embodiment illustrated in FIG. 1, the communication between the user of the speakerphone 105 and the user of the communication device 170 is a voice communication. In at least one embodiment, the communication device 170 is a telephone.

In an example operation of the system 100 of FIG. 1, the speakerphone 105 is configured to be used in either the handset mode or the speakerphone mode. In various embodiments, when the speakerphone 105 is in the speakerphone mode, the base audio input 120 is configured to receive an audio input, such as speech, from the user of the speakerphone 105. The audio processing system 125 processes the audio input to produce the transmit audio signal 150. The AGC module 155 controls a send output level of the transmit audio signal based upon a comparison of the send output level of the transmit audio signal and a send output level threshold value using automatic gain control to produce a controlled transmit audio signal 160. The send output level of the transmit audio signal 160 is a measure of an output level of the transmit audio signal 160 is proportional to the transmit volume level of the speakerphone 105, and consequently, the perceived loudness of the voice of the user of the speakerphone 105 as received by the user of the communication device 170. In the speakerphone mode of communication, frequent changes of the user's mouth position with respect to the base audio input 120 can make a substantial impact on the send output level of the transmit audio signal. By controlling the send output level of the transmit audio signal using automatic gain control as described in various embodiments, fluctuations in volume level caused by changes in the position of the user relative to the speakerphone 105 or changes in the level of the user's voice are substantially reduced or eliminated.

Figure 2:
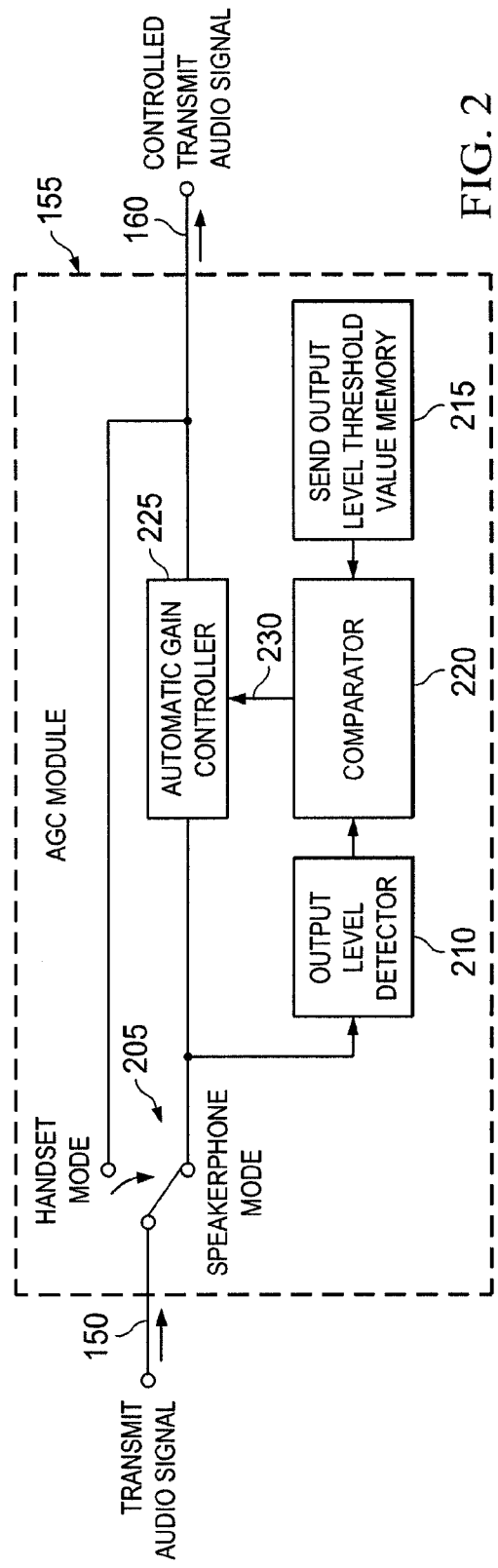
FIG. 2 is an embodiment of an automatic gain control (AGC) module for controlling the transmit volume level of a speakerphone.

FIG. 2 is an embodiment of the AGC module 155 for controlling the transmit volume level of a speakerphone 105. The AGC module 155 includes a mode switch 205, an output level detector 210, a send output level threshold value memory 215, a comparator 220, and an automatic gain controller 225. The switch 205 is configured to switch between a handset mode and a speakerphone mode of the speakerphone 105. When the mode switch 205 is in the handset mode, the transmit audio signal 150 from the audio processing system 125 is output from the AGC module 155 as the control transmit audio signal 160 with the send output level of the transmit audio signal 150 remains substantially the same. When the mode switch 205 is in the speakerphone mode, the transmit audio signal 150 is sent to the output level detector 210 in the automatic gain controller 225. The output level detector 210 is configured to measure the send output level of the transmit audio signal 150. The send output level threshold value memory 215 is configured to store a send output level threshold value that is determined in accordance with the various embodiments described herein. In various embodiments, the send output level threshold value is determined such that the send output level of the audio transmit signal is controlled so that send output level of the audio transmit signal is maintained to at least at a minimum send output level. Embodiments of processes to determined the send output level threshold value are further discussed with respect to FIGS. 3-5.

Still referring to FIG. 2, the comparator 220 is configured to compare the send output level of the transmit audio signal measured by the output level detector 210 with the send output level threshold value stored in the send output level threshold value memory 215. As a result of the comparison, the comparator 220 outputs a control signal 230 to the automatic gain controller 225. Using automatic gain control, the automatic gain controller 225 controls the send output level of the transmit audio signal 150 based upon the comparison of the send output level of the transmit audio signal 150 and the send output level threshold value to produce the controlled transmit audio signal 160. In at least one embodiment, if the measured send output level of the transmit audio signal 150 is less than the send output level threshold value, the automatic gain controller 225 will add the difference as a gain to the send output level to produce the controlled transmit audio signal 160. The controlled transmit audio signal 160 is then sent out over the telecommunication network(s) 165 to the user associated with the communication device 170. In at least one embodiment, if the measured send output level of the transmit audio signal 150 is greater than or equal to the send output level threshold value, the automatic gain controller 225 will not contribute any additional gain to the send output level of the transmit audio signal 150. Accordingly, the send output level of the controlled transmit audio signal 160 will be substantially the same as the send output level of the transmit audio signal 150. By controlling the send output level of the transmit audio signal 150, fluctuations in the send output level transmit audio signal 150 due to changes in a user's distance or mouth direction with respect to the speakerphone base 110, or changes in the volume of the user's voice, may be reduced or eliminated.

Figure 3:
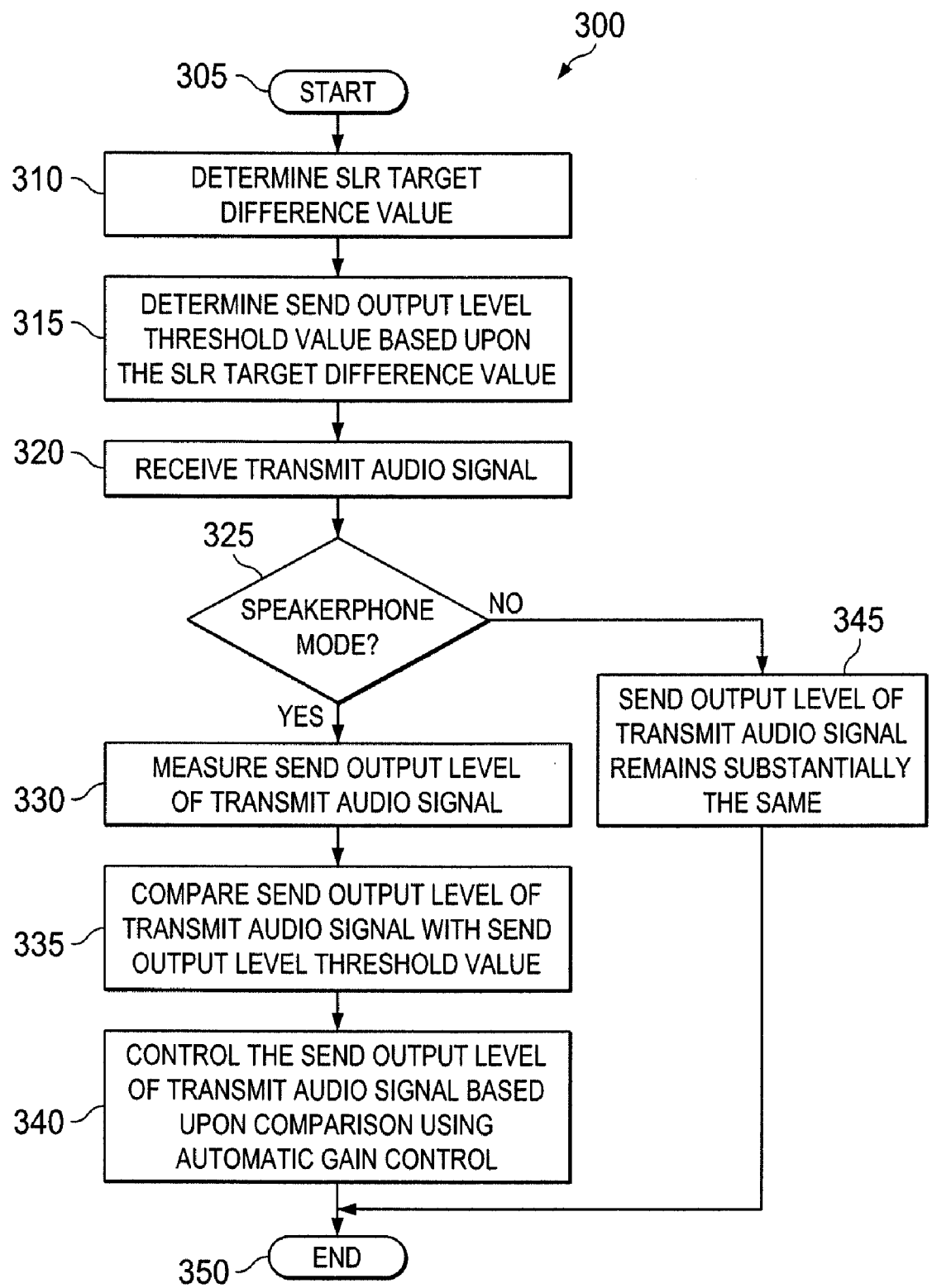
FIG. 3 is an embodiment of a procedure for controlling the transmit volume level of a speakerphone.

FIG. 3 is an embodiment of a procedure 300 for controlling the transmit volume level of a speakerphone. The procedure begins in step 305. In step 310, a send loudness rating (SLR) target difference value between a speakerphone SLR target value and a handset SLR target value is determined. The SLR represents a measure of expressing a sending frequency response based on objective signal tone measurements in a way which relates to how a speech signal would be perceived by a listener. The SLR value corresponds to a perceived loudness loss of a connection of a predetermined line length, such as a 0 km, a 2.7 km, or a 4.6 km line length, and is representative of system losses. More positive values of SLR represent quieter send levels while more negative values of SLR represent louder send levels. The SLR provides a measure of a sending sensitivity of the speakerphone 105, and differs from an amplitude value of the send output level of the transmitted audio signal measured at the transmission port of the speakerphone 105. In a particular embodiment, the SLR parameter of a speakerphone is measured in both the speakerphone and handset mode at all loop links of interest following procedures as specified by one or more industry standards or drafts, requirements, or recommendation. An example of an industry standard draft is TIA-TR-41.3.10 by the Telecommunications Industry Association (TIA) incorporated herein by reference. In a particular embodiment, it is desirable for the SLR values for the speakerphone 105 to fall within the ranges specified in Table 1 to meet the particular industry standard specified by TIA-TR-41.3.10 or other desired industry standards or recommendations.

TABLE 1

Send Loudness Rating Limits
Send Loudness Rating (SLR)

| Artificial line, km | Nominal dB | Mandatory Range, dB |
|---|---|---|
| 0 | 11 | 22 to 6 |
| 2.7 | 13 | 24 to 8 |

Table 1 provides nominal SLR values and mandatory ranges for line length of 0 km, 2.7 km, and 4.6 km. In various embodiments, a speakerphone SLR target value representative of a desired SLR value in a speakerphone mode is determined. In a particular embodiment, a nominal value of a SLR for a speakerphone is chosen as the speakerphone SLR target value. In a particular embodiment, the nominal SLR value for the speakerphone SLR target value are chosen based on the recommendations specified in Table 1 above. The handset SLR target value is determined based on a nominal value for SLR for a handset. In a particular embodiment, the handset SLR target value is 8 dB. In still other embodiments, the handset SLR target value may range between 5 and 11 dB. In the presently described embodiment, the SLR target difference value is obtained by subtracting the handset SLR target value from the speakerphone SLR target value which represents the change in SLR between a nominal, or reference, speakerphone operating in a handset mode and a speakerphone mode.

In step 315, the send output level threshold value is determined based at least in part upon the SLR target difference value. In a particular embodiment, the send output level threshold value is determined to be equal to a nominal send output value of a reference handset telephone minus the SLR target difference value plus an enhancement factor. The handset nominal send output value, in at least one embodiment, is chosen according to one or more industry standards and represents a desired send output value associated with a reference handset. The value of the enhancement factor is chosen to compensate for a difference in loudness level at which a typical speaker talks between using a speakerphone 105 in the speakerphone mode and the handset mode. For example, a typical speaker will speak louder in the speakerphone mode than in the handset mode. In a particular embodiment, the enhancement factor, or gain offset, is chosen to be equal to −2 dBV. A dBV is a measure of voltage relative to a 1 volt reference level. In still other embodiments, the enhancement factor is chosen to be between −2 dBV and −4 dBV. In particular embodiments, the determined send output level threshold value is stored in the send output level threshold value memory 215. In at least one embodiment, the send output level threshold value is determined and stored in the send output level threshold value memory 215 during manufacture of the speakerphone 105. In still other embodiments, the send output level threshold value may be determined and stored in the send output level threshold value memory 215 after manufacture of the speakerphone 105. Further embodiments of particular procedures for determining a send output level threshold value for a digital speakerphone and an analog speakerphone are discussed with respect to FIGS. 4 and 5, respectively.

In step 320, a transmit audio signal 150 is received by the AGC module 155. In the described embodiment, the transmit audio signal 150 originates as a voice input by a speaker received by either the base audio input 120 if the speakerphone 105 is operating in the speakerphone mode, or the handset audio input 140 if the speakerphone 105 is operating in the handset mode. The received voice input is processed by the audio processing system 125 to produce the transmit audio signal 150. In step 325, it is determined if the speakerphone 105 is in the speakerphone mode. If the speakerphone 105 is in the speakerphone mode, the procedure 300 continues to step 330. In step 330, the send output level of the transmit audio signal is measured by the output level detector 210. In step 335, the send output level of the transmit audio signal is compared by the comparator 220 with the send output level threshold value stored in the send output level threshold value memory 215. In step 340, the send output level of the transmit audio signal is controlled based upon the comparison using automatic gain control by the automatic gain controller 225. In at least one embodiment, if the measured send output level of the transmit audio signal is less than the send output level threshold value, the automatic gain controller 225 will add the difference as a gain to the send output level of the transmit audio signal. If the measured send output level of the transmit audio signal is greater than or equal to the send output level threshold value, then the automatic gain controller 225 will pass the transmit audio signal with the same send output level without adding any gain. If it is determined in step 335 that the speakerphone 105 is not in a speakerphone mode, (i.e., it is in the handset mode) the procedure 300 continues to step 345. In step 345, the send output level of the transmit audio signal remains substantially the same without any modification by the AGC controller 225. In step 350, the procedure 300 ends.

Figure 4:
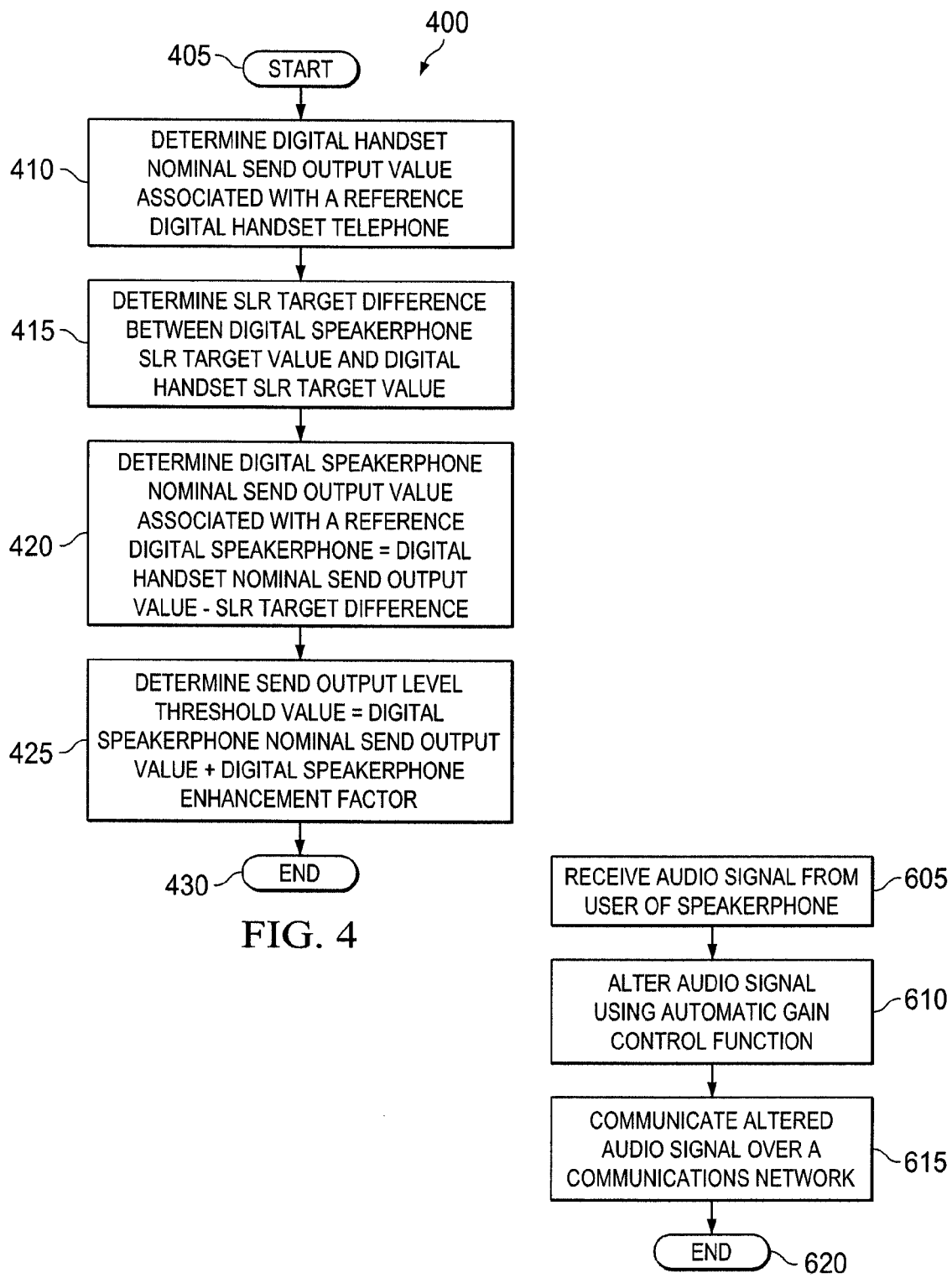
FIG. 4 is an embodiment of a procedure for determining a send output level threshold value for a digital speakerphone.

FIG. 4 is an embodiment of a procedure 400 for determining a send output level threshold value for a digital speakerphone. In the embodiment illustrated in FIG. 4, the speakerphone 105 is a digital speakerphone. In step 410, a digital handset nominal send output value associated with a reference digital handset telephone is determined. In a particular embodiment, the digital handset nominal send output value is determined in accordance with the following equations using values from industry standards, such as the Telecommunications Industry Association (TIA) standard TIA-810-B approved Nov. 3, 2006, incorporated herein by reference.

1. Handset Nominal Send (Transmit 1 khz) Sensitivity=−12.89 dBV/Pa where the Handset Nominal Send (Transmit) 1 kHz Sensitivity represents a nominal transmit signal sensitivity of a digital handset at frequency of 1 kHz. In a particular embodiment, the value of −12.89 dBV/Pa is obtained from Table D.4 of TIA-810-B.

2. Handset Nominal Send Sensitivity=Send Electrical Test Point (SETP) Output (dBV)—Mouth Reference Point Input (dBPa)

where the SETP Output is representative of an output level of a transmit signal obtained from an output of a digital handset. The Mouth Reference Point Input is representative of a sound pressure level receive at an audio input of a digital handset at a reference mouth point located at a reference distance, the Mouth Reference Point, from the audio input. In a particular embodiment the mouth reference point is equal to 25 mm as described in TIA-810-B.

3. Send Electrical Test Point Output (dBV)=Handset Nominal Send Sensitivity+Mouth Reference Point Input (dBPa)

where a Mouth Reference Point Input value of −4.7 dBPa is used in a particular embodiment as obtained from TIA-810-B as representing a reference test signal level at the Mouth Reference Point.

4. Send Electrical Test Point Output (dBV)=(−12.89 dBV/Pa)+(−4.7 dBPa) −17.59 dBV.

Setting the Send Electrical Test Point Output as the desired valued of the Digital Handset Nominal Send Output value:

5. Digital Handset Nominal Send Output=−17.59 dBV

In step 415, an SLR target difference between (1) a digital speakerphone SLR target value and (ii) a digital handset SLR target value is determined. In step 420, a digital speakerphone nominal send output value associated with a reference digital speakerphone is determined. In a particular embodiment, the digital speakerphone nominal send output value is equal to the digital handset nominal send output value minus the SLR target difference. In a particular embodiment, the SLR target difference between (i) the digital speakerphone SLR target value and digital handset SLR target value, and (ii) the digital speakerphone nominal send output value associated with a reference digital speakerphone is determined according to the following equations:

6. Digital Speakerphone Nominal Send Output=Digital Handset Nominal Send Output−SLR Target Difference
7. where: SLR Target Difference=Digital Speakerphone SLR Target−Digital Handset SLR Target Setting the Digital Speakerphone SLR Target to a value of +13.00 and the Digital Handset SLR Target to a value of +8.00 as described in TIA 810-B, and using the Digital Handset Nominal Send Output determined in 410 yields.

8. Digital Speakerphone Nominal Send Output=(−17.59 dBV)−(+13.00 dB−+8.00 dB)=−22.59 dBV In step 425, the send output level threshold value for the digital speakerphone is determined. The send output level threshold value is equal to the digital speakerphone nominal send output value plus a digital speakerphone enhancement factor. The digital speakerphone enhancement factor is representative of a typical difference between a speaker speaking in a handset mode and a speakerphone mode. In a particular embodiment, the digital speakerphone enhancement factor is equal to −2 dBV. In still other embodiments, the digital speakerphone enhancement factor may be in a range of −2 dBV to −3 dBV. In a particular embodiment, by adding an enhancement factor of −2 dBV to the −22.59 digital speakerphone nominal send output produces a send output level threshold value for the digital speakerphone equal to −24.59 dBV. In still other embodiments, the send output level threshold value may be in a range of −22 dBV to −25 dBV. In step 430, the procedure 400 ends. After the send output level threshold value for the digital speakerphone is determined, the send output level threshold may be used to control a transmit audio signal 150 as described with respect to FIG. 3.

Figure 5:
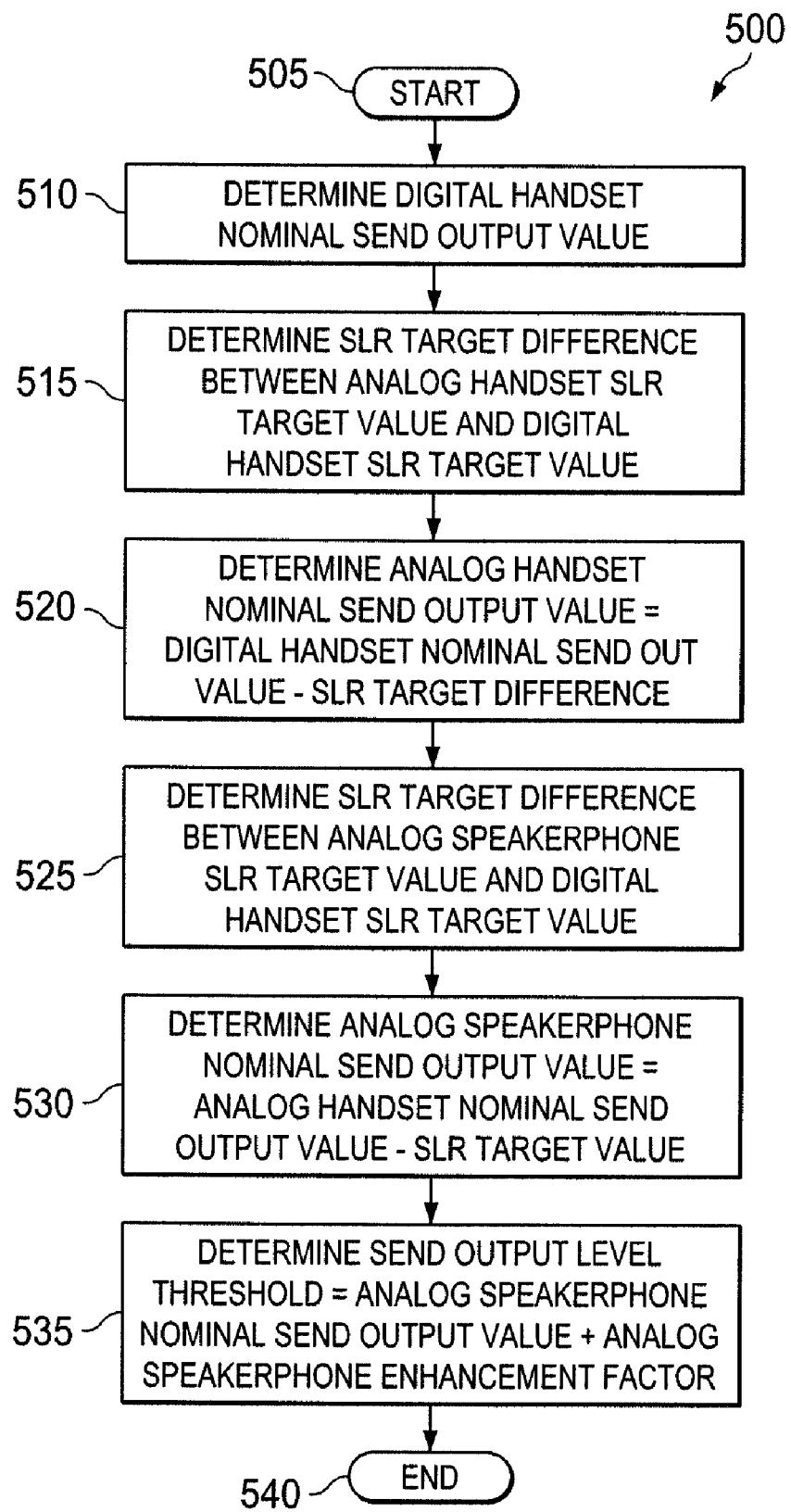
FIG. 5 is an embodiment of a procedure for determining a send output level threshold value for an analog speakerphone.

FIG. 5 is an embodiment of a procedure 500 for determining a send output level threshold value for an analog speakerphone. In the embodiment illustrated in FIG. 5, the speakerphone 105 is an analog speakerphone. The procedure 500 begins in step 505. In step 510, a digital handset nominal send output value is determined. In this particular embodiment, the digital handset nominal send output value is determined in accordance with the procedure as described with respect to step 410 of FIG. 4. In step 515, an SLR target difference between an analog handset SLR target value and a digital handset SLR target value is determined. In step 520, an analog handset nominal send output value is determined based upon the digital handset nominal send output value minus the SLR target difference determined in step 515. In a particular embodiment, the SLR target difference and the analog (PSTN) handset nominal send output value is determined in accordance with the following equations:

9. PSTN Handset Nominal Send Output=Digital Handset Nominal Send Output−SLR Target Difference
10. where: SLR Target Difference=PSTN Handset SLR Target−Digital Handset SLR Target Setting the Digital Handset Nominal Send Output to the value determined from step 410, the PSTN Handset SLR Target value equal to +8.00 as described for a 2.7 km length as found in TIA standard TIA 470.110-C approved Apr. 13, 2004, and incorporated herein by reference, and setting the Digital Handset SLR Target value to +8.00 as found in TIA 810-B yields:

11. PSTN Handset Nominal Send Output=(−17.59 dBV)−(+8.00 dB−+8.00 dB)=−17.59 dBV In step 525, an SLR target difference between an analog speakerphone SLR target value and a digital handset SLR target value is determined. In a particular embodiment, the digital handset SLR target value is used instead of an analog handset SLR target value because existing standards may not provide guidelines for determining an SLR target value for an analog handset. In step 530, an analog speakerphone nominal send output value is determined. The analog speakerphone nominal send output value is equal to the analog handset nominal send output value minus the SLR target value determined in step 525. In a particular embodiment, the SLR target difference between the analog speakerphone SLR target value and digital handset SLR target value, as well as the analog speakerphone nominal send output value, is determined according to the following equations:

12. PSTN (analog) Speakerphone Nominal Send Output=Analog Handset Nominal Send Output−SLR Target Difference
13. where: SLR Target Difference=PSTN Speakerphone SLR Target−Digital Handset SLR Target Setting the PSTN Speakerphone SLR target equal to +13.00 as described in TIA 470.120-C for 2.7 km length, and the Digital Handset SLR Target equal to +8.00 as described in TIA 810-B 14. PSTN (analog) Speakerphone Nominal Send Output=(−17.59 dBV)−(+13.00 dB−+8.00 dB)=−22.59 dBV In step 535, the send output level threshold for the analog speakerphone is determined. The send output level threshold is equal to the analog speakerphone nominal send output value plus an analog speakerphone enhancement factor. In a particular embodiment, the analog speakerphone enhancement factor is in a range of −2 dBV to −3 dBV. In a particular embodiment, an analog speakerphone enhancement factor of −2 dBV is added to a PSTN (analog) Speakerphone Nominal Send Output value of −22.59 to obtain a send output level threshold value for an analog speakerphone of −24.59. In still other embodiments, the analog speakerphone enhancement factor is within a range of −2 dBV to −3 dBV yielding a send output level threshold value in a range of −22 dBV to −26 dBV. In step 540, the procedure 500 ends. After the send output level threshold value for the analog speakerphone is determined, it may be used to control a transmit audio signal 150 as described with respect to FIG. 3.

FIG. 6 is another embodiment of a procedure 600 for controlling the transmit volume level of a speakerphone. In step 605, an audio signal from a user of a speakerphone 105 is received by the AGC module 155. In a particular embodiment, the audio signal is the transmit audio signal 150. In step 610, the AGC module 155 alters the audio signal by applying an automatic gain control function to the audio signal. In some embodiments, altering the transmit audio signal includes measuring an output level of the audio signal, comparing the output level of the audio signal with an output level threshold value, and altering the output level of the audio signal based upon the comparison of the output level of the audio signal and the output level threshold value. In various embodiments, altering the audio signal includes controlling an output level of the audio signal using one or more of the procedures as described with respect to FIGS. 1-5. In particular embodiments, the output level of the audio signal is a send output level of the transmit audio signal 150. In step 615, the altered audio signal is communicated over a communications network, such as telecommunication network(s) 165. In step 620, the procedure 600 ends.

When the procedures described herein for controlling the transmit volume of a speakerphone are implemented in an existing speakerphone system, procedures for implementation may vary according to whether the existing speakerphone system already includes automatic gain control (AGC) via existing software and/or hardware. If an existing speakerphone does not include AGC, an automatic gain controller may be incorporated into the existing speakerphone transmit system. In various embodiments, additional software may be needed to control or otherwise integrate the AGC. In various embodiments, the AGC can share some of the existing modules in the speakerphone system, such as, an existing amplifier circuit. Further, in some embodiments, the AGC may share some of the existing software of the speakerphone system, such as, existing gain control software. If the existing speakerphone does have AGC implemented in the speakerphone system, then a determination is made whether the AGC is located within the transmission circuitry and available to the transmission system of the speakerphone. If the AGC is available to the transmission system of the speakerphone, there is no need to incorporate AGC in the transmission system of the speakerphone. Otherwise, an AGC is incorporated into the transmission system. If the AGC is not located in the transmission circuitry and no part of the AGC is available for sharing with the transmission circuitry of the speakerphone, then an AGC is incorporated into the transmission circuitry of the speakerphone system. If any part, either software or hardware, of the AGC is available for sharing with the transmission circuitry of the speakerphone system, that part or parts required by the embodiment subscribed therein do not need to be included in the speakerphone while modules that do not exist, as described herein, will need to be included.

In some embodiments, the speakerphone 105 may include a soft-key or a hard-key to a user to selectively turn the AGC module 155 on or off. In a particular embodiment, the AGC module 155 stays on by default. In still other embodiments of the invention, the speakerphone 105 may include filtering to filter the audio input signal received by the base audio input 120 and/or the transmit audio signal 150 in order to comply with any requirements. For example, the filtering may filter out audio signals received by a microphone of the speakerphone 105 that are determined to be noise and/or outside of the normal voice range so that such audio signals, such as noise, are not included when the send output level of the transmit audio signal is amplified. Accordingly, extraneous noise in the environment around the speakerphone may not be used when measuring and/or controlling the send output level of the transmit audio signal in some embodiments.

The illustrative embodiments can take the form of an entirely hardware embodiment, an entirely software embodiment, or an embodiment containing both hardware and software elements. Furthermore, the illustrative embodiments can take the form of a computer program product accessible from a computer-usable or computer-readable medium providing program code for use by or in connection with a computer or any instruction execution system. For the purposes of this description, a computer-usable or computer-readable medium can be any tangible apparatus that can contain, store, communicate, propagate, or transport the program for use by or in connection with the instruction execution system, apparatus, or device. In various embodiments, the automatic gain control (AGC) module 155 includes one or more processors operable to execute computer executable instructions from a computer-usable or computer-readable medium to perform the various capabilities of the automatic gain control (AGC) module 155 described herein.

The computer-usable or computer-readable medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory RAM), a read-only memory (ROM), a rigid magnetic disk, and an optical disk. Current examples of optical disks include compact disk-read only memory (CD-ROM), compact disk-read/write (CD-R/W), and DVD.

Further, a computer storage medium may contain or store a computer-readable program code, such that when the computer-readable program code is executed on a computer, the execution of this computer-readable program code causes the computer to transmit another computer-readable program code over a communication link. This communication link may use a medium that is, for example, without limitation, physical, or wireless.

The previous detailed description is of a small number of embodiments for implementing the invention and is not intended to be limiting in scope. One of skill in this art will immediately envisage the methods and variations used to implement this invention in other areas than those described in detail. The following claims set forth a number of the embodiments of the invention disclosed with greater particularity.

What is claimed as new and desired to be protected by Letters Patent of the United States is:

1. A method for controlling the transmit volume level of a speakerphone comprising: receiving a transmit audio signal;

and if the speakerphone is in a speakerphone mode: measuring a send output level of the transmit audio signal; comparing the send output level of the transmit audio signal with a send output level threshold value; and controlling the send output level of the transmit audio signal based upon the comparison of the send output level of the transmit audio signal and the send output level threshold value using automatic gain control and further comprising: determining a send loudness rating (SLR) target difference value between a speakerphone SLR target value and a handset SLR target value; determining the send output level threshold value based upon the SLR target difference value.

2. The method of claim 1, wherein the controlling includes amplifying the send output level of the transmit audio signal using automatic gain control if the send output level of the transmit audio signal is less than the send output level threshold value.

3. The method of claim 2, wherein amplifying the send output level of the transmit audio signal includes adding the difference between the send output level threshold value and the send output level of the transmit audio signal as a gain to the send output level of the transmit audio signal.

4. The method of claim 1, wherein the controlling includes passing the transmit audio signal with substantially the same send output level if the send output level of the transmit audio signal is greater than or equal to the send output level threshold value.

5. The method of claim 1, wherein the speakerphone is a digital speakerphone, and determining the send output level threshold value based upon the SLR target difference value further comprises:
   determining a digital handset nominal send output value associated with a reference digital handset telephone;
   determining a digital speakerphone nominal send output value associated with a reference digital speakerphone, the digital speakerphone nominal send output value being equal to the digital handset nominal send output value minus an SLR target difference between a digital speakerphone SLR target value and a digital handset SLR target value; and
   determining the send output level threshold value by adding an digital speakerphone enhancement factor to the digital speakerphone nominal send output value.

6. The method of claim 5, wherein the digital speakerphone enhancement factor is in a range of −2 dBV to −3 dBV.

7. The method of claim 5, wherein the send output level threshold value is in a range of −22 dBV to −25 dBV.

8. The method of claim 1, wherein the speakerphone is an analog speakerphone, and determining the send output level threshold value based upon the SLR target difference value further comprises:
   determining a digital handset nominal send output value associated with a reference digital handset telephone;
   determining an analog handset nominal send output value associated with a reference analog handset telephone, the analog handset nominal send output value being equal to the digital handset nominal send output value minus an SLR target difference between an analog handset SLR target value and a digital handset SLR target value;
   determining an analog speakerphone nominal send output value associated with a reference analog speakerphone, the analog speakerphone nominal send output value equal to the analog handset nominal send output value minus an SLR target difference between an analog speakerphone SLR target value and a digital handset SLR target value; and
   determining the send output level threshold value by adding an analog speakerphone enhancement factor to the analog speakerphone nominal send output value.

9. The method of claim 8, wherein the analog speakerphone enhancement factor is in a range of −2 dBV to −3 dBV.

10. The method of claim 8, wherein the send output level threshold value is in a range of −2 dBV to −26 dBV.

11. The method of claim 1, wherein if the speakerphone is in a handset mode, the send output level of the transmit audio signal remains substantially the same.

12. A method of controlling the transmit volume level of a speakerphone comprising: receiving an audio signal from a user of a speakerphone; altering the audio signal by applying an automatic gain control function to the audio signal; and communicating the altered audio signal over a communications network; wherein altering the transmit audio signal includes: measuring an output level of the audio signal; comparing the output level of the audio signal with an output level threshold value; and altering the output level of the audio signal based upon the comparison of the output level of the audio signal and the output level threshold value and further comprising: determining a send loudness rating (SLR) target difference value between a speakerphone SLR target value and a handset SLR target value; determining the send output level threshold value based upon the SLR target difference value.

13. An apparatus for controlling the transmit volume level of a speakerphone comprising: an automatic gain control module, the automatic gain control module configured to: receive a transmit audio signal; and if the speakerphone is in a speakerphone mode: measure a send output level of the transmit audio signal; compare the send output level of the transmit audio signal with a send output level threshold value; and control the send output level of the transmit audio signal based upon the comparison of the send output level of the transmit audio signal and the send output level threshold value using automatic gain control and wherein the send output level threshold value is determined based upon a send loudness rating (SLR) target difference value between a speakerphone SLR target value and a handset SLR target value.

14. The apparatus of claim 13, wherein controlling the send output level includes amplifying the send output level of the transmit audio signal using automatic gain control if the send output level of the transmit audio signal is less than the send output level threshold value.

15. The apparatus of claim 14, wherein amplifying the send output level of the transmit audio signal includes adding the difference between the send output level threshold value and the send output level of the transmit audio signal as a gain to the send output level of the transmit audio signal.

16. The apparatus of claim 13, wherein controlling the send output level includes passing the transmit audio signal with substantially the same send output level if the send output level of the transmit audio signal is greater than or equal to the send output level threshold value.

17. The apparatus of claim 13, wherein if the speakerphone is in a handset mode, the send output level of the transmit audio signal remains substantially the same.

* * * * *